(12) United States Patent
Long et al.

(10) Patent No.: US 7,046,517 B2
(45) Date of Patent: May 16, 2006

(54) ELECTRICALLY ISOLATED SEMI-LOCKING HINGE FOR COOLING SYSTEM

(75) Inventors: Brian J. Long, Folsom, CA (US); Paul J. Gwin, Orangevale, CA (US); Rolf A. Konstad, Gold River, CA (US)

(73) Assignee: Intel Corporation, Santa Clara, CA (US)

( * ) Notice: Subject to any disclaimer, the term of this patent is extended or adjusted under 35 U.S.C. 154(b) by 233 days.

(21) Appl. No.: 10/749,732

(22) Filed: Dec. 30, 2003

(65) Prior Publication Data

US 2005/0141191 A1    Jun. 30, 2005

(51) Int. Cl.
*H05K 7/16* (2006.01)

(52) U.S. Cl. ............ 361/725; 361/694; 361/695; 24/489; 24/573.11; 403/330; 16/422

(58) Field of Classification Search .......... 361/600, 361/610, 679, 687, 694, 695, 725, 754, 755, 361/798, 801; 24/573.11; 312/223.1, 233.2, 312/326, 327, 223.2; 454/184; 292/38; 411/508, 913; 16/315; 403/321, 324, 330; 248/505, 510, 680, 694

See application file for complete search history.

(56) References Cited

U.S. PATENT DOCUMENTS

| 2,584,173 | A | * | 2/1952 | Fowler | 312/303 |
|---|---|---|---|---|---|
| 3,266,859 | A | * | 8/1966 | Champlin | 312/323 |
| 4,947,289 | A | * | 8/1990 | Dynie | 361/801 |
| 4,960,384 | A | * | 10/1990 | Singer et al. | 439/155 |
| 5,745,342 | A | * | 4/1998 | Jeffries et al. | 361/683 |
| 5,793,614 | A | * | 8/1998 | Tollbom | 361/732 |
| 5,946,196 | A | * | 8/1999 | Baek | 361/798 |
| 6,430,041 | B1 | * | 8/2002 | Johnson et al. | 361/687 |
| 6,445,576 | B1 | * | 9/2002 | Wooden et al. | 361/683 |
| 6,711,015 | B1 | * | 3/2004 | Syring et al. | 361/695 |
| 2004/0174686 | A1 | * | 9/2004 | Rubenstein | 361/801 |

* cited by examiner

*Primary Examiner*—Lynn Feild
*Assistant Examiner*—Robert J. Hoffberg
(74) *Attorney, Agent, or Firm*—Jeffrey B. Huter

(57) ABSTRACT

A cooling system hinge mounted to a portion of an enclosure of an electronic system to which a cooling device may be releasably and pivotably attached in at least an open position to permit access to components within the electronic system and a closed position to permit installation of a cover to close the enclosure.

26 Claims, 10 Drawing Sheets

ELECTRICALLY ISOLATED SEMI-LOCKING HINGE FOR COOLING SYSTEM

BACKGROUND

As part of continuing efforts to increase the speed and functionality of integrated circuits (ICs) such as processors, there has been a continuing need to dissipate ever greater quantities of heat generated by such ICs during normal operation. This has required cooling systems of ever greater capacities.

Until recently, it was acceptable to use a heatsink held in contact with a surface of such ICs to conduct heat away from such ICs and disperse the heat into air blown through the heatsink via a fan. However, the quantities of heat dissipated by such ICs has continued to increase, requiring increases in the dissipative surface area of such heatsinks, the use of ever heavier materials to make such heatsinks (most notably, copper versus aluminum), and the use of ever greater flows of air over the surfaces of such heatsinks. All of these increased requirements have resulted in the provision of ever larger and more cumbersome heatsinks that must somehow be kept in contact with a surface of such ICs attached to a circuitboard without crushing or otherwise damaging either such ICs or the circuitboards to which they are attached.

Indeed, these requirements have each increased to such an extent as to draw into question the entire idea of using a heatsink with a fan in contact with a surface of such an IC as being a desirable solution. As a result, alternatives such as the use of a liquid cooling system are being seriously considered. However the use of a liquid cooling system is not without difficulties. The use of a liquid coolant flowing through hoses, a heat absorber, a heat emitter, a pump, etc., raises difficulties that would be familiar to those skilled in the art of water and steam cooling and heating systems used in homes and buildings, including leaks, variations in pressure, galvanic reactions between components, etc.

As liquid cooling of such ICs shows signs of becoming a new mainstream solution for electronic systems used in high volumes, a need exists to mount the components of such a liquid cooling system within such electronic systems that minimizes such difficulties.

BRIEF DESCRIPTION OF THE DRAWINGS

The objects, features, and advantages of the invention as hereinafter claimed will be apparent to one skilled in the art in view of the following detailed description in which:

DETAILED DESCRIPTION

Figure 1A:
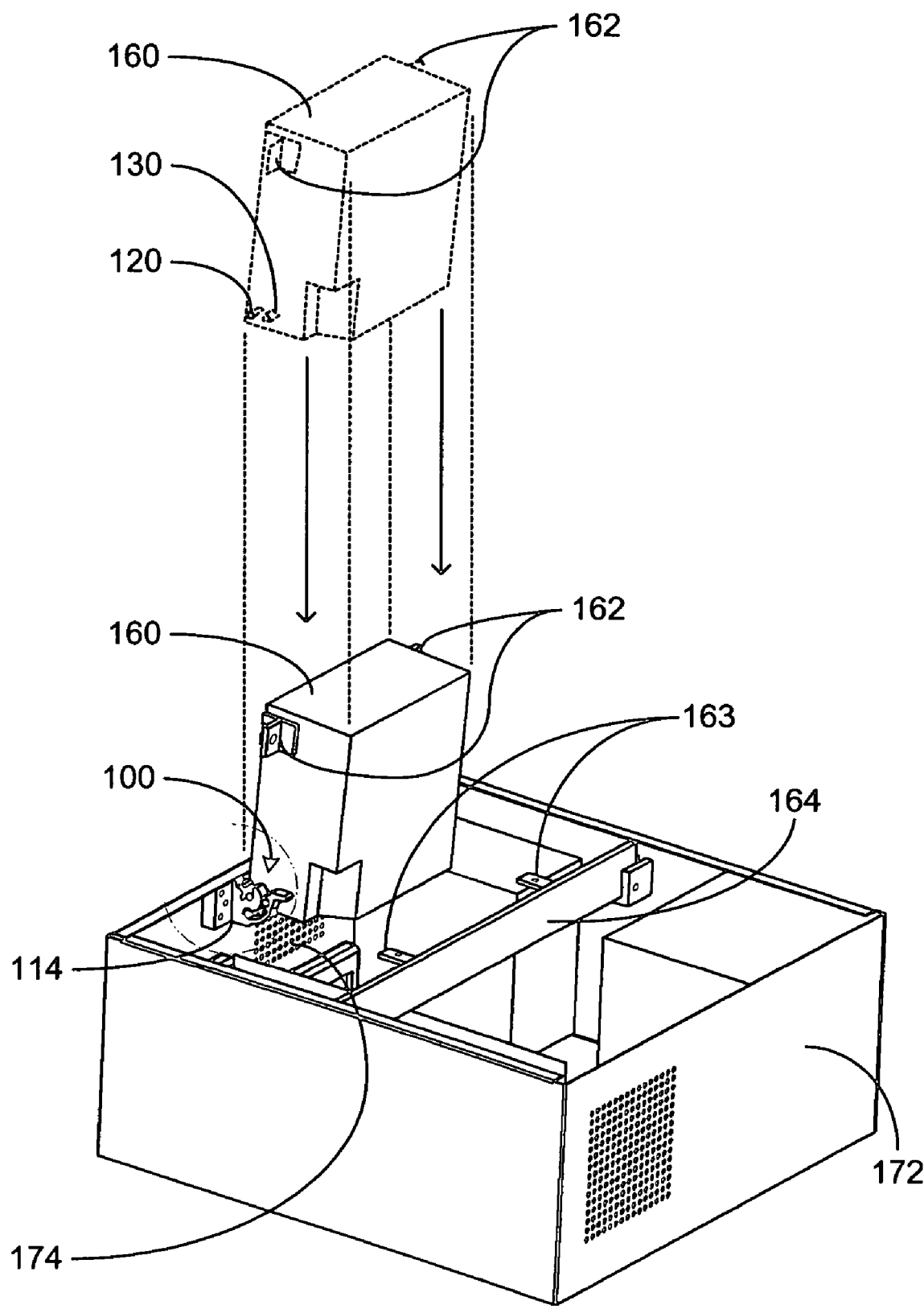
FIGS. 1a, 1b, 1c and 1d depict embodiments of one of a pair of cooling system hinges and an assembly employing a pair of cooling system hinges.

Although numerous details are set forth for purposes of explanation and to provide a thorough understanding in the following description, it will be apparent to those skilled in the art that these specific details are not required in order to practice embodiments of the invention as hereinafter claimed. For example, although embodiments are discussed with reference to an IC device such as a processor in a computer system, it will be readily apparent to those skilled in the art that teachings of the claimed invention may be applied to other forms of IC installed within other types of electronic systems. Also, although embodiments are discussed with reference to a liquid cooling system, the teachings of the claimed invention may be applied to other forms of cooling system with physically separated components for absorbing and emitting heat, including heatpipes.

FIGS. 1a through 1d depict embodiments of one of a pair of cooling system hinges and an assembly employing a pair of cooling system hinges. Assembly 150 is made up principally of a pair of cooling system hinges 100 (only one of which is visible), cooling system 160 and enclosure 170. Enclosure 170 is made up of chassis 172 and cover 176, and in various embodiments, at least part of both chassis 172 and cover 176 are made up of metal. Also, enclosure 170 is the enclosure of an electronic system having an IC within that relies on cooling system 160 to aid in removing and releasing heat generated by the IC during normal operation of the electronic system. In some embodiments, enclosure 170 is the enclosure of a computer system, and the IC relying on cooling system 160 is a processor (and in some variations, perhaps more than one processor). In some embodiments, cooling system 160 employs a liquid to conduct heat away from the IC with the liquid being circulating between a heat absorber directly attached to the IC and cooling system 160 via hoses. Cooling system 160 employs a fan, possibly within cooling system 160, itself, to force air through cooling system 160 as part of releasing heat conducted to cooling system 160 from the IC to the surrounding air. In some embodiments, air inlet 178 is formed through cover 176 at a location that is aligned with air inlet 168 of cooling system 160 through which cooling system 160 takes in air, and air outlet 174 is formed through chassis 172 at a location that may or may not be aligned with air outlet (not visible) through which cooling system 160 outputs the air taken in through air inlet 168 after heat conducted to cooling system 160 from the IC has been released by transferring it to that air.

Figure 1B:
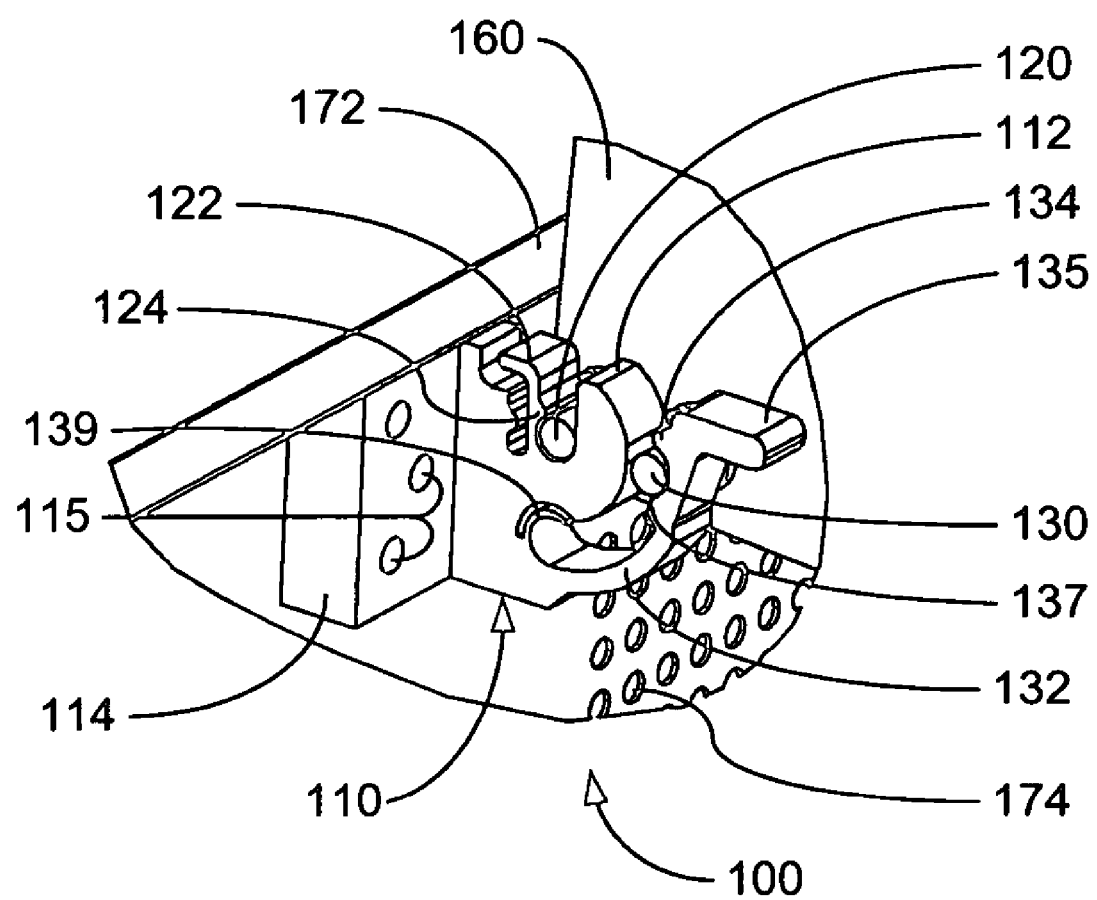
Figure 1C:
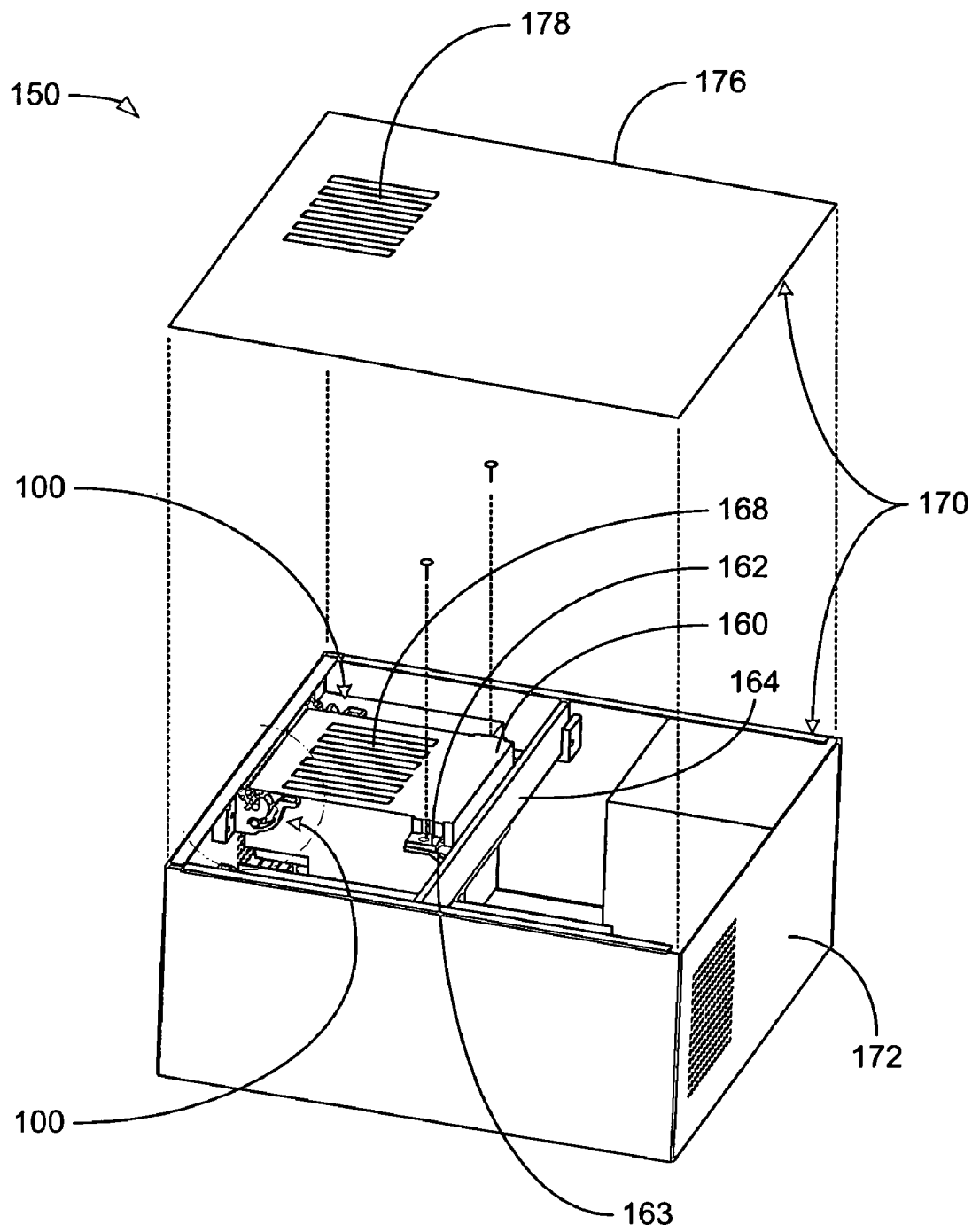
Figure 1D:
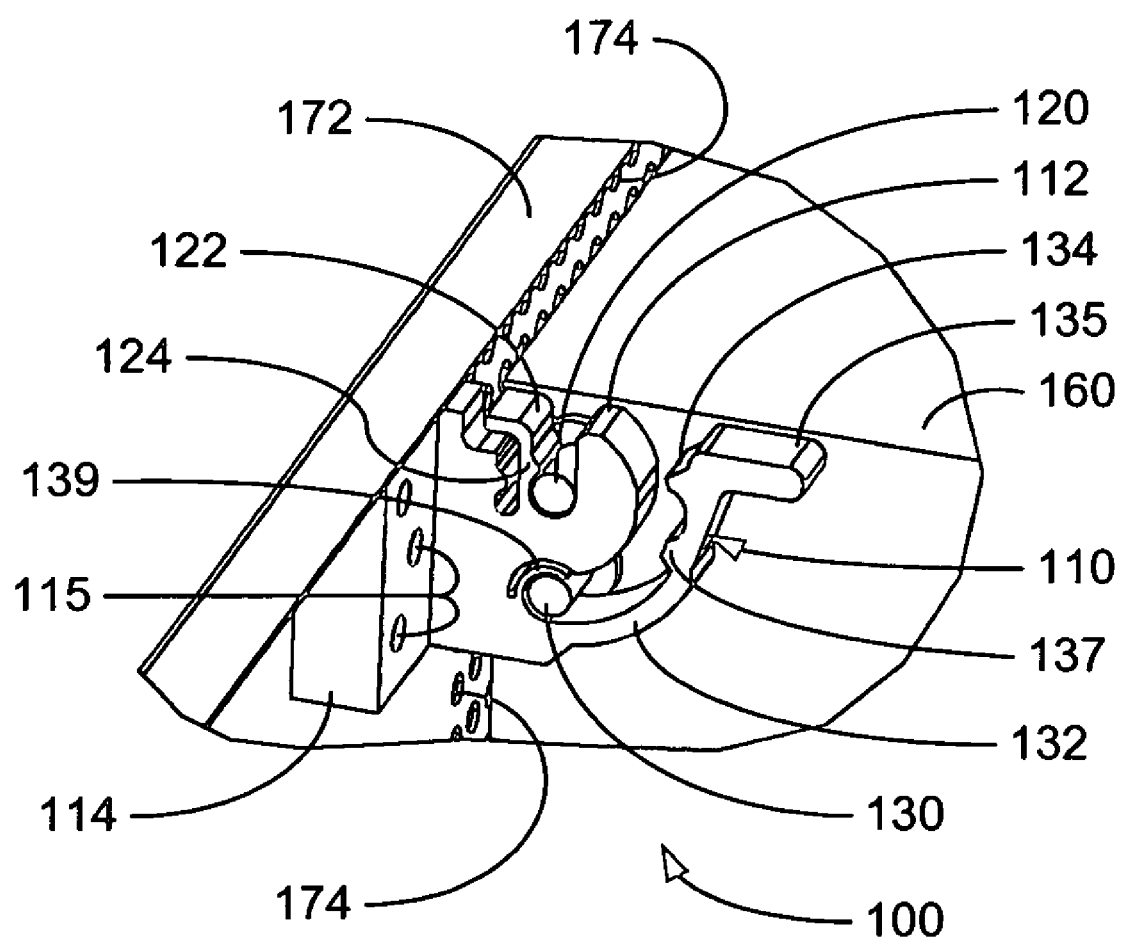

Each one of cooling system hinges 100 (of which one of the pair is shown) is made up principally of hinge mount 110, hinge pin 120 and lock pin 130. A pair of hinge mounts 110 are attached to a portion of chassis 172, while a pair of both hinge pins 120 and lock pins 130 are attached to opposing sides of cooling system 160 so as to engage with corresponding ones of the pair of hinge mounts 110. In the case of each one of the pair of cooling system hinges 100, hinge mount 110, hinge pin 120 and lock pin 130 cooperate to aid in releasably retaining cooling system 160 in engagement with chassis 172 such that cooling system 160 may either be pivotably attached to chassis 172 or entirely detached from chassis 172, as depicted in FIG. 1a. Furthermore, when cooling system 160 is pivotably attached to chassis 172, the pivotable nature of this attachment allows cooling system 160 to be pivoted into and retained in at least either an "open" position relative to chassis 170, as depicted in FIGS. 1a–b, or a "closed" position relative to chassis 170 as depicted in FIGS. 1c–d.

Hinge mount 110 is made up principally of mounting base 114 with central beam 112, hinge pin holding beam 122, lock pin holding beam 132 and lock pin indicator beam 139 emanating from mounting base 114. Mounting base 114 provides mounting points 115 by which mounting base 114 of hinge mount 110 may be attached to a portion of chassis 170 as part of creating assembly 150. In some embodiments, mounting points 115 are made up of multiple holes formed through mounting base 114 through which rivets, screws, etc. may be inserted as part of making the attachment of mounting base 114 to a portion of chassis 172. However, as those skilled in the art will readily recognize, alternate embodiments may employ alternate forms of mounting points 115 that use any of a variety of mechanisms to attach mounting base 114 to a portion of chassis 172 are possible without departing from the spirit and scope of the claimed invention. In some embodiments, each one of hinge mount 110 is made from injection-molded plastic or similar material, thereby electrically isolating cooling system 160 from chassis 172 such that electric currents that might be conducted through cooling liquid between a heat absorber attached to the IC and cooling system 160 are not allowed to be further conducted between cooling system 160 and chassis 172, thereby aiding in the prevention of galvanic corrosion and/or the creation of ground loops.

Pairs of both hinge pin 120 and lock pin 130 are attached to and protrude from opposing sides of cooling system 160 to engage corresponding ones of pairs of hinge mounts 110 attached to chassis 172. In the case of each single cooling system hinge 100, hinge pin 120 is positioned to protrude into the groove defined between central beam 112 and hinge pin holding beam 122, and lock pin 130 is positioned to protrude into a groove defined between central beam 112 and lock pin holding beam 132. Both of these grooves in each one of the pair of cooling system hinges 100 are open on one end to allow cooling system 160 to be pivotably attached to chassis 172 by inserting corresponding ones of hinge pins 120 and lock pins 130 into these grooves. Bump 124 is positioned on hinge pin holding beam 122 to partially constrict the opening in one end of the groove defined between hinge pin holding beam 122 and central beam 112, and hinge pin holding beam 122 is fabricated to be flexible such that hinge pin holding beam 122 and bump 124 cooperate to releasably retain the cylindrical side of hinge pin 120 within this groove and against central beam 112 when hinge pin 120 is inserted into this groove as part of bringing cooling system 160 into pivotable attachment with chassis 172. Specifically, this arrangement allows hinge pin 120 to be pushed into or pulled out of this groove if sufficient force is used to cause hinge pin 120 to engage bump 124 such that hinge pin holding beam 122 is moved away from central beam 112, causing bump 124 to be moved out of the path of hinge pin 120. Similarly, bump 134 is positioned on lock pin holding beam 132 to partially constrict the opening in one end of the groove defined between lock pin holding beam 132 and central beam 112, and lock pin holding beam 132 is fabricated to be flexible such that lock pin holding beam 132 and bump 134 cooperate to releasably retain the cylindrical side of lock pin 130 within this groove and against central beam 112 when lock pin 130 is inserted into this groove as part of bringing cooling system 160 into pivotable attachment with chassis 172. This arrangement allows lock pin 130 to be pushed into or pulled out of this groove if thumb tab 135 on the end of lock pin holding beam 132 is operated to move away from central beam 112, causing bump 134 to be moved out of the path of lock pin 130.

Lock pin indicator beam 139 is positioned towards the end of the groove defined between lock pin holding beam 132 and central beam 112 that is nearest mounting base 114 to engage and releasably retain lock pin 130 in that end of the groove when cooling system 160 is pivoted to a closed position. In some embodiments, lock pin 130 may be released from such retention if sufficient force is used in pivoting cooling system 160 such that lock pin 130 is able to push against lock pin indicator beam 139 and move lock pin indicator beam 139 out of the path of lock pin 130. In other embodiments, thumb tab 135 is operated to move lock pin holding beam 132 away from central beam 112 so as to widen the path of lock pin 130 enough to enable lock pin 130 to move past lock pin indicator beam 139. In some embodiments, lock pin indicator beam 139 is positioned such that lock pin 130 is releasably retained between lock pin indicator beam 139 and lock pin holding beam 132 (as depicted). In other embodiments, lock pin indicator beam 139 is positioned such that lock pin 130 is releasably retained between lock pin indicator beam 139 and central beam 112. In some embodiments, lock pin indicator beam 139 is configured to engage lock pin 130 such that onset and release of the force required to move lock pin 130 past lock pin indicator beam 139 provides positive tactile feedback that confirms to an a person pivoting cooling system 160 that lock pin 130 has been moved into and/or out of releasable retention effected by lock pin indicator beam 139. Also, in some embodiments, the lock pin indicator beam 139 is provided to aid in retaining cooling system 160 in the closed position such that the position of cooling system 160 does not impede the opening and/or closure of enclosure 170 through the removal and/or installation of cover 176. Keeping cooling system 160 out of the path of cover 176 may be particularly desirable if the removal and/or installation of cover 176 entails some degree of sliding of cover 176 relative to chassis 172.

Bump 137 is positioned towards the end of the groove defined between lock pin holding beam 132 and central beam 112 that is nearest the opening by which lock pin 130 may be moved into or out of the groove, as described at length, earlier. Bump 137 is positioned close enough to bump 134 to releasably retain lock pin 130 between bump 134, bump 137 and central beam 112 such that lock pin 130 may be held motionless within this groove, thereby releasably restraining pivoting movement by cooling system 160 such that cooling system 160 is releasably retained in the open position. In some embodiments, lock pin 130 may be released from such retention if sufficient force is used in pivoting cooling system 160 such that lock pin 130 is able to push against bump 137 to cause lock pin holding beam 132 to move away from central beam 112 enough to move bump 137 out of the path of lock pin 130. In other embodiments, thumb tab 135 is operated to move lock pin holding beam 132 away from central beam 112 so as to move bump 137 out of the path of lock pin 130.

In some embodiments, chassis 172 may provide crossbeam 164 with crossbeam tabs 163 to engage screws used with cooling system tabs 162 to aid in retaining cooling system 160 in a closed position. In such an embodiment, cooling system 160 may be pivoted on the pair of cooling system hinges 100 into closed position relative to chassis 172, and then screws (or other fasteners) installed to attach cooling system tabs 162 to crossbeam tabs 163, and then cover 176 may be installed with the screws carrying out this attachment not protruding through cover 176. In alternate embodiments, chassis 172 may not provide either crossbeam 164 or crossbeam tabs 163, and the pair of cooling system hinges 100, perhaps with aforedescribed retention function provided by a corresponding pair of lock pin indicator beams 139, may aid in retaining cooling system 160 in a closed position so that cover 176 may be installed with screws subsequently installed so as to protrude through cover 176 to engage cooling system tabs 162 and thereby hold cooling system 160 in a closed position.

Figure 2:
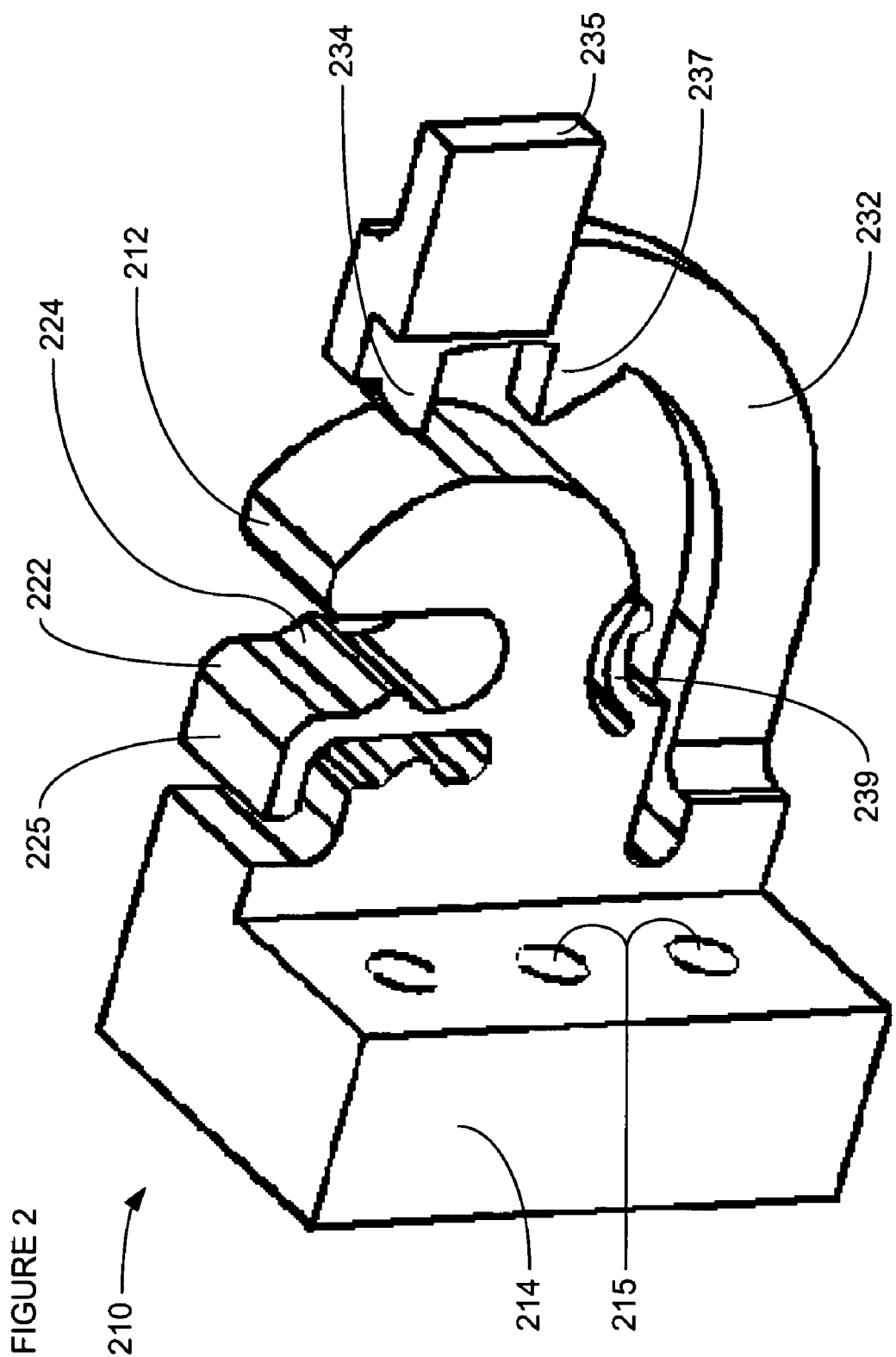
FIG. 2 depicts an embodiment of hinge mount.

FIG. 2 depicts an embodiment of hinge mount. Similarly to hinge mount 110 of FIGS. 1a–d, hinge mount 210 is made up principally of mounting base 214 with central beam 212, hinge pin holding beam 222, lock pin holding beam 232 and lock pin indicator beam 239 emanating from mounting base 214. Mounting base 214 provides mounting points 215 by which mounting base 214 of hinge mount 210 may be attached to a portion of a chassis (not shown). In some embodiments, mounting points 215 are made up of multiple holes formed through mounting base 214 through which rivets, screws, etc. may be inserted as part of making the attachment of mounting base 214 to a portion of a chassis. However, as those skilled in the art will readily recognize, alternate embodiments may employ alternate forms of mounting points 215 that use any of a variety of mechanisms to attach mounting base 214 to a portion of a chassis are possible without departing from the spirit and scope of the claimed invention. In some embodiments, hinge mount 210 is made from injection-molded plastic or similar material, thereby electrically isolating a liquid-based cooling system from a chassis into which the cooling system is installed such that electric currents that might be conducted through cooling liquid between a heat absorber attached to an IC being cooled within the chassis and the cooling system are not allowed to be further conducted between the cooling system and the chassis, thereby aiding in the prevention of galvanic corrosion and/or the creation of ground loops.

Similarly to hinge mount 110 of FIGS. 1a–d, a groove is defined in hinge mount 210 between central beam 212 and hinge pin holding beam 222, and another groove is defined between central beam 212 and lock pin holding beam 232. Both of these grooves are open on one end to allow a hinge pin and a lock pin carried by and protruding from a side of a cooling system to be inserted to pivotably attach the cooling system to a chassis. Bump 224 is positioned on hinge pin holding beam 222 to partially constrict the opening in one end of the groove defined between hinge pin holding beam 222 and central beam 212, and hinge pin holding beam 222 is fabricated to be flexible such that hinge pin holding beam 222 and bump 224 cooperate to releasably retain the cylindrical side of a hinge pin carried by a cooling system within this groove and against central beam 212 when the hinge pin is inserted into this groove as part of bringing the cooling system into pivotable attachment with a chassis. Specifically, this arrangement allows a hinge pin to be pushed into or pulled out of this groove if sufficient force is used to cause the hinge pin to engage bump 224 such that hinge pin holding beam 222 is moved away from central beam 212, causing bump 224 to be moved out of the path of the hinge pin. Furthermore, this arrangement allows hinge pin 220 to be removed from this groove by operating thumb tab 225 to bend hinge pin holding beam 222 away from central beam 212, again causing bump 224 to be moved out of the path of hinge pin 220. Similarly, bump 234 is positioned on lock pin holding beam 232 to partially constrict the opening in one end of the groove defined between lock pin holding beam 232 and central beam 212, and lock pin holding beam 232 is fabricated to be flexible such that lock pin holding beam 232 and bump 234 cooperate to releasably retain the cylindrical side of a lock pin within this groove and against central beam 212 when a lock pin is inserted into this groove as part of bringing a cooling system into pivotable attachment with a chassis. Like lock pin holding beam 132 of hinge mount 110 of FIGS. 1a–d, this arrangement allows a lock pin to be pushed into or pulled out of this groove if thumb tab 235 on the end of lock pin holding beam 232 is operated to move lock pin holding beam 232 relative to central beam 212, causing bump 234 to be moved out of the path of the lock pin. However, unlike lock pin holding beam 132 of hinge mount 110, the cross section of lock pin holding beam 232 is such that the path of movement allowed for by the flexibility of lock pin holding beam 232 tends to be a sideways motion relative to central beam 212, versus the pulling away motion of lock pin holding beam 132 relative to central beam 112. Indeed, the configuration and position of thumb tab 235 is such as to encourage being operated to cause such a sideways motion.

Like lock pin indicator beam 139 of hinge mount 110 of FIGS. 1a–d, lock pin indicator beam 239 is positioned towards the end of the groove defined between lock pin holding beam 232 and central beam 212 that is nearest mounting base 214 to engage and releasably retain a lock pin in that end of the groove when a cooling system is pivoted to a closed position relative to a chassis to which hinge mount 210 is attached. In some embodiments, a lock pin may be released from such retention if sufficient force is used in pivoting a cooling system such that a lock pin carried by the cooling system is able to push against lock pin indicator beam 239 and move lock pin indicator beam 239 out of the path of the lock pin. In some embodiments, lock pin indicator beam 239 is positioned such that a lock pin is releasably retained between lock pin indicator beam 239 and lock pin holding beam 232 (as depicted). In other embodiments, lock pin indicator beam 239 is positioned such that a lock pin is releasably retained between lock pin indicator beam 239 and central beam 212. In some embodiments, lock pin indicator beam 239 is configured to engage a lock pin such that onset and release of the force required to move the lock pin past lock pin indicator beam 239 provides positive tactile feedback that confirms to a person pivoting the cooling system that carries the lock pin that the lock pin has been moved into and/or out of releasable retention by lock pin indicator beam 239. Also, in some embodiments, the lock pin indicator beam 239 is provided to aid in retaining a cooling system in the closed position relative to a chassis to which the cooling system has been pivotably attached such that the position of the cooling system does not impede the opening and/or closure of the enclosure of which the chassis is a part.

Like bump 137 of hinge mount 110 of FIGS. 1a–d, bump 237 is positioned towards the end of the groove defined between lock pin holding beam 232 and central beam 212 that is nearest the opening by which a lock pin may be moved into or out of the groove. Bump 237 is positioned close enough to bump 234 to releasably retain a lock pin between bump 234, bump 237 and central beam 212 such that a lock pin may be held motionless within this groove, thereby releasably restraining pivoting movement by a cooling system that carries the lock pin such that the cooling system is releasably retained in an open position relative to a chassis to which the cooling system has been pivotably attached. In some embodiments, thumb tab 235 is operated to move lock pin holding beam 232 sideways relative to central beam 212 so as to move bump 237 out of the path of a lock pin.

Figure 3A:
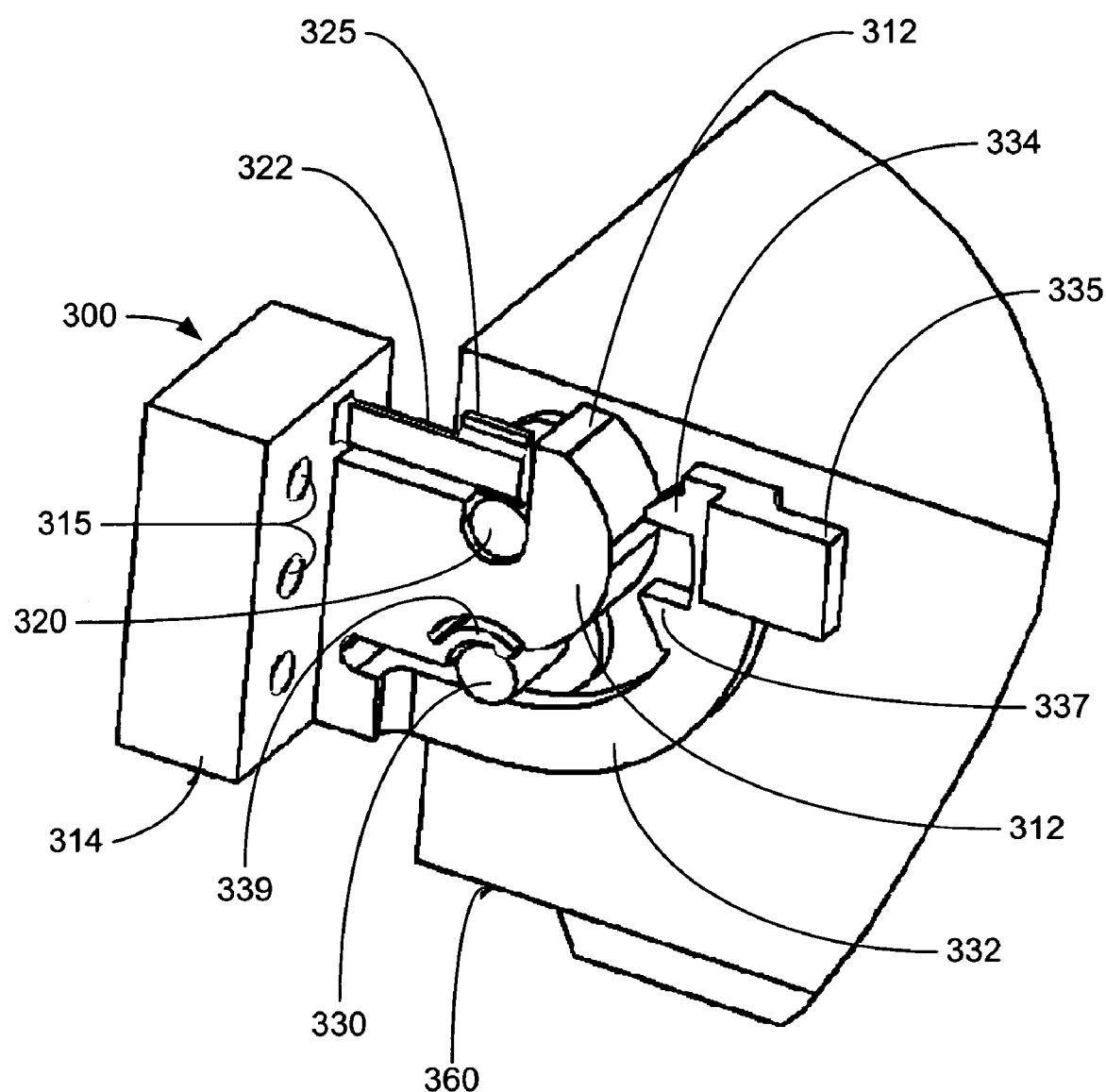
FIGS. 3a and 3b depict embodiments of a pair of cooling system hinges.
Figure 3B:
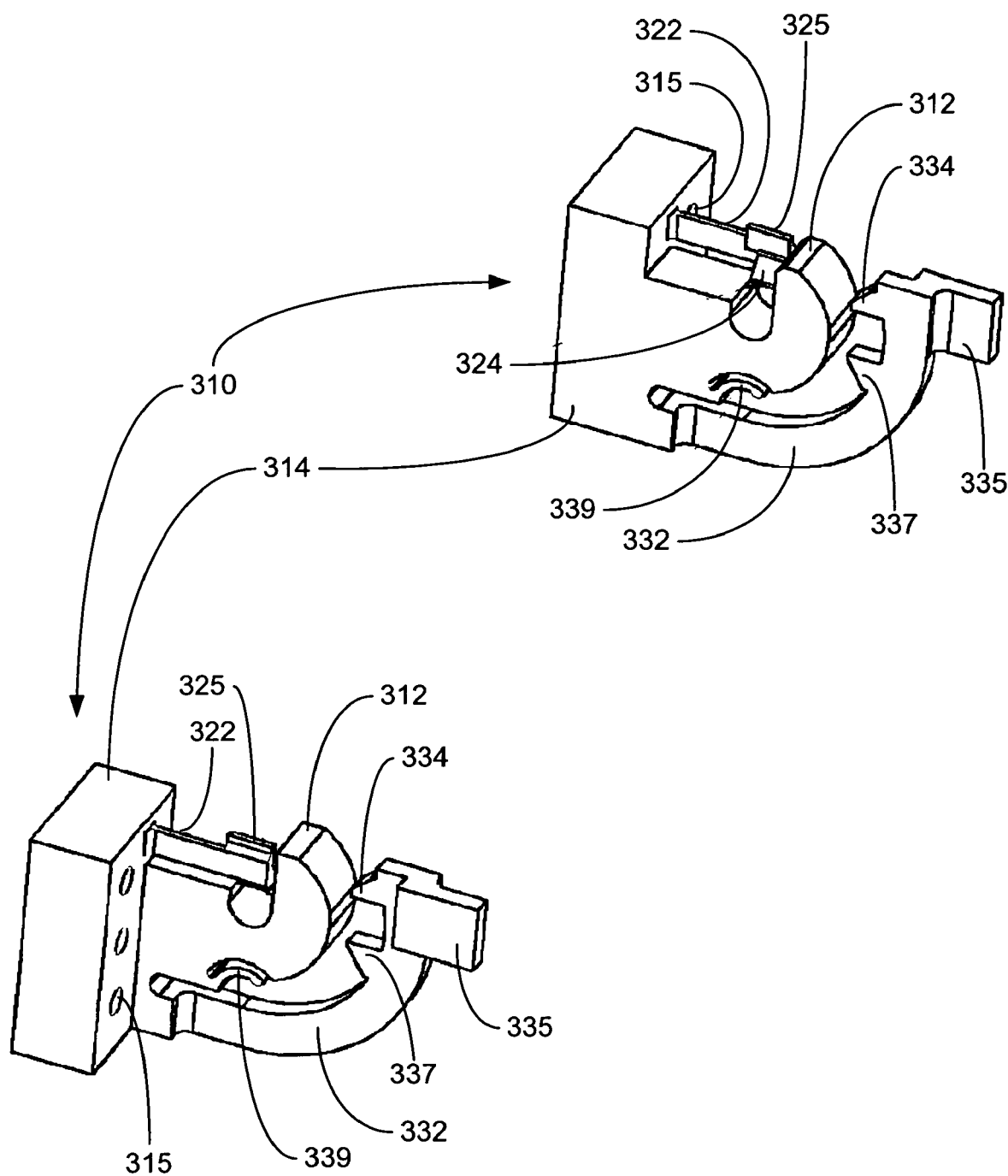

FIGS. 3a and 3b depict embodiments of a pair of cooling system hinges. Each one of cooling system hinges 300 is made up principally of hinge mount 310, hinge pin 320 and lock pin 330. A pair of hinge mounts 310 are attached to a portion of a chassis, while a pair of both hinge pins 320 and lock pins 330 are attached to opposing sides of cooling system 360 so as to engage with corresponding ones of the pair of hinge mounts 310. In the case of each one of the pair of cooling system hinges 300, hinge mount 310, hinge pin 320 and lock pin 330 cooperate to aid in releasably retaining cooling system 360 in engagement with a chassis such that cooling system 360 may either be pivotably attached to the chassis or entirely detached from the chassis. Furthermore, when cooling system 360 is pivotably attached to a chassis, the pivotable nature of this attachment allows cooling system 360 to be pivoted into and retained in at least either an "open" or a "closed" position relative to a chassis, as previously discussed at length with regard to FIGS. 1a–d.

Similarly to hinge mount 110 of FIGS. 1a–d and hinge mount 210 of FIG. 2, hinge mount 310 is made up principally of mounting base 314 with central beam 312, hinge pin holding beam 322, lock pin holding beam 332 and lock pin indicator beam 339 emanating from mounting base 314. Mounting base 314 provides mounting points 315 by which mounting base 314 of hinge mount 310 may be attached to a portion of a chassis. In some embodiments, mounting points 315 are made up of multiple holes formed through mounting base 314 through which rivets, screws, etc. may be inserted as part of making the attachment of mounting base 314 to a portion of a chassis. However, as those skilled in the art will readily recognize, other mechanisms to attach mounting base 314 to a portion of a chassis are possible without departing from the spirit and scope of the claimed invention. In some embodiments, each one of hinge mount 310 is made from injection-molded plastic or similar material, thereby electrically isolating cooling system 360 from a chassis to which cooling system 360 is pivotably attached such that electric currents that might be conducted through cooling liquid between a heat absorber attached to an IC being cooled within the chassis and cooling system 360 are not allowed to be further conducted between cooling system 360 and the chassis, thereby aiding in the prevention of galvanic corrosion and/or the creation of ground loops.

Similarly to hinge pins 120 and 220, and lock pins 130 and 230, pairs of both hinge pin 320 and lock pin 330 are attached to and protrude from opposing sides of cooling system 360 to engage corresponding ones of a pair of hinge mounts 310 attached to a chassis spaced apart from each other in the manner depicted in FIG. 3b such that cooling system 360 may be positioned between hinge mounts 310 as the engagement between hinge mounts 310 and corresponding ones of hinge pins 320 and lock pins 330 takes place. In the case of each single cooling system hinge 300, hinge pin 320 is positioned to protrude into the groove defined between central beam 312 and hinge pin holding beam 322, and lock pin 330 is positioned to protrude into a groove defined between central beam 312 and lock pin holding beam 332. Both of these grooves in each one of the pair of cooling system hinges 300 are open on one end to allow cooling system 360 to be pivotably attached to a chassis to which hinge mounts 310 are attached by inserting corresponding ones of hinge pins 320 and lock pins 330 into these grooves.

However, unlike either hinge mounts 110 or 210, bump 324 is positioned on hinge pin holding beam 322 and hinge pin holding beam 322 is positioned relative to hinge mount 310 to engage both the outwardly protruding ends and cylindrical sides of hinge pins 320 (versus engaging only the cylindrical sides as previously discussed) to releasably retain hinge pin 320 within the groove defined between central beam 312 and hinge pin holding beam 322 when hinge pin 320 is inserted into this groove as part of bringing cooling system 360 into pivotable attachment with a chassis. Specifically, this arrangement allows hinge pin 320 to be pushed into this groove if sufficient force is used to cause both the circular edge and the end of hinge pin 320 to engage bump 324 such that hinge pin holding beam 322 is bent sideways from central beam 312, causing bump 324 to be moved out of the path of the end of hinge pin 320, but then allows bump 324 to engage the cylindrical side of hinge pin 320 after hinge pin 320 has been inserted into this groove beyond the location of bump 324. Furthermore, this arrangement allows hinge pin 320 to be removed from this groove by operating thumb tab 325 to bend hinge pin holding beam 322 sideways from central beam 312, again causing bump 324 to be moved out of the path of the end of hinge pin 320.

In a manner more similar to hinge mount 210 than hinge mount 110, bump 334 is positioned on lock pin holding beam 332 to partially constrict the opening in one end of the groove defined between lock pin holding beam 332 and central beam 312, and lock pin holding beam 332 is fabricated to be flexible such that lock pin holding beam 332 and bump 334 cooperate to releasably retain the cylindrical side of lock pin 330 within this groove and against central beam 312 when lock pin 330 is inserted into this groove as part of bringing cooling system 360 into pivotable attachment with a chassis into which cooling system 360 is being pivotably installed. The cross section of lock pin holding beam 332 is such that the path of movement allowed for by the flexibility of lock pin holding beam 332 tends to be a sideways motion relative to central beam 312, and the configuration and position of thumb tab 335 is such as to encourage being operated to cause such a sideways motion.

Also similarly to hinge mount 210, lock pin indicator beam 339 is positioned towards the end of the groove defined between lock pin holding beam 332 and central beam 312 that is nearest mounting base 314 to engage and releasably retain lock pin 330 in that end of the groove when cooling system 360 is pivoted to a closed position relative to a chassis. In some embodiments, lock pin 330 may be released from such retention if sufficient force is used in pivoting cooling system 360 such that lock pin 330 is able to push against lock pin indicator beam 339 and move lock pin indicator beam 339 out of the path of lock pin 330. In some embodiments, lock pin indicator beam 339 is positioned such that lock pin 330 is releasably retained between lock pin indicator beam 339 and lock pin holding beam 332 (as depicted). In other embodiments, lock pin indicator beam 339 is positioned such that lock pin 330 is releasably retained between lock pin indicator beam 339 and central beam 312. In some embodiments, lock pin indicator beam 339 is configured to engage lock pin 330 such that onset and release of the force required to move lock pin 330 past lock pin indicator beam 339 provides positive tactile feedback that confirms to a person pivoting cooling system 360 that lock pin 330 has been moved into and/or out of releasable retention by lock pin indicator beam 339. Also, in some embodiments, the lock pin indicator beam 339 is provided to aid in retaining cooling system 360 in the closed position relative to a chassis such that the position of cooling system 360 does not impede the opening and/or closure of the enclosure of which the chassis is a part.

Much like bump 237 of hinge mount 210, bump 337 is positioned towards the end of the groove defined between lock pin holding beam 332 and central beam 312 that is nearest the opening by which lock pin 330 may be moved into or out of the groove. Bump 337 is positioned close enough to bump 334 to releasably retain lock pin 330 between bump 334, bump 337 and central beam 312 such that lock pin 330 may be held motionless within this groove, thereby releasably restraining pivoting movement by cooling system 360 such that cooling system 360 is releasably retained in an open position relative to a chassis to which cooling system 360 has been pivotably attached. In some embodiments, thumb tab 335 is operated to move lock pin holding beam 332 sideways relative to central beam 312 so as to move bump 337 out of the path of lock pin 330.

As is depicted in FIG. 3b, it should be noted that various possible embodiments of cooling system hinge 300 may be fabricated as mirror-image pairs. In other words, in an effort to provide a large enough portion on hinge mount 314 to accommodate needed mounting points 315, while also leaving sufficient space between pairs of cooling system hinges 300, some embodiments may be fabricated as matching "left" and "right" pairs. Alternatively, for ease of fabrication and economies of scale, other embodiments may fabricate both hinge mounts 314 of a pair of hinges 300 as entirely identical pieces.

Figure 4A:
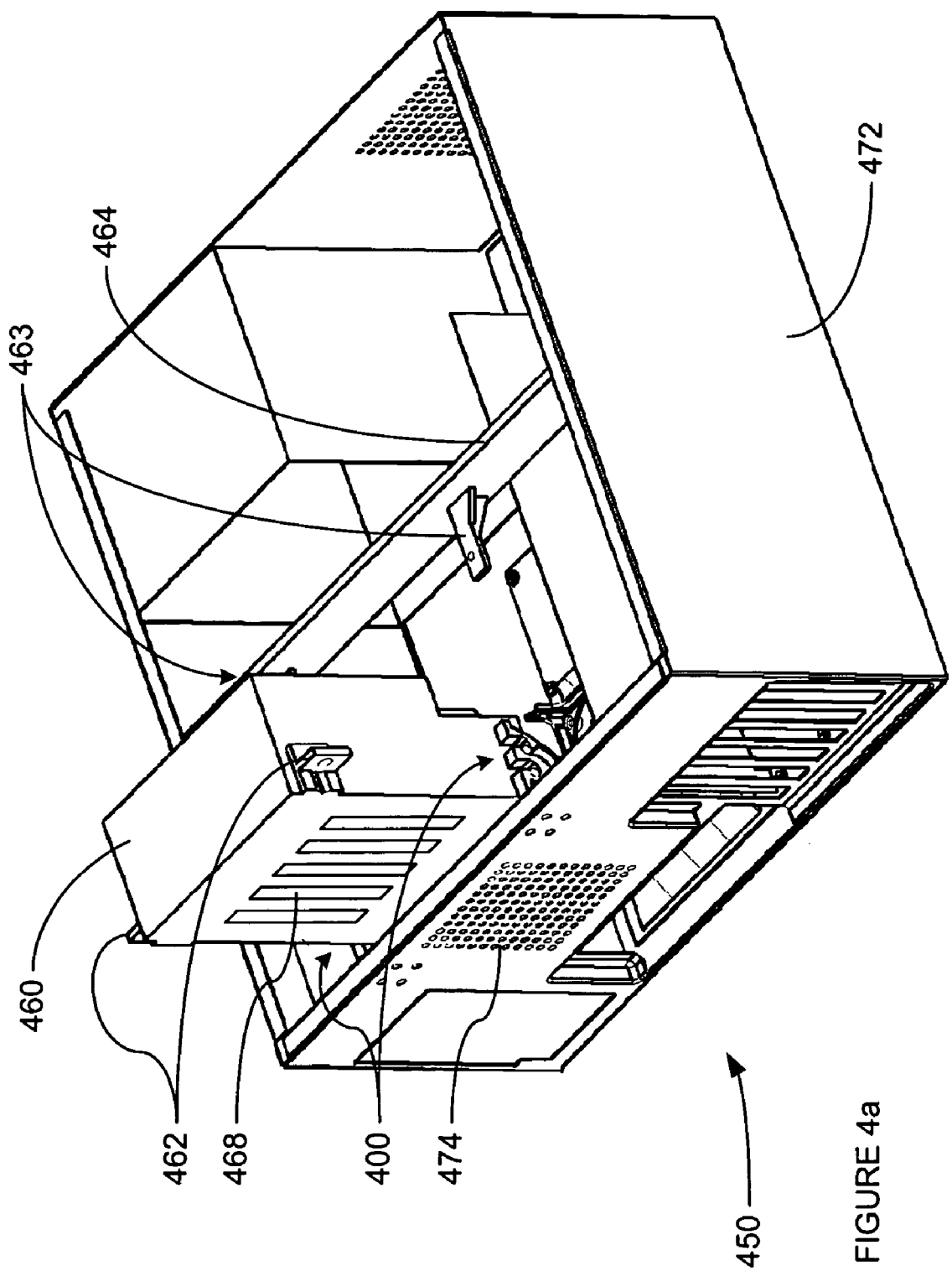
FIGS. 4a, 4b and 4c depict embodiments of one of a pair of cooling system hinges and an assembly employing a pair of cooling system hinges.
Figure 4B:
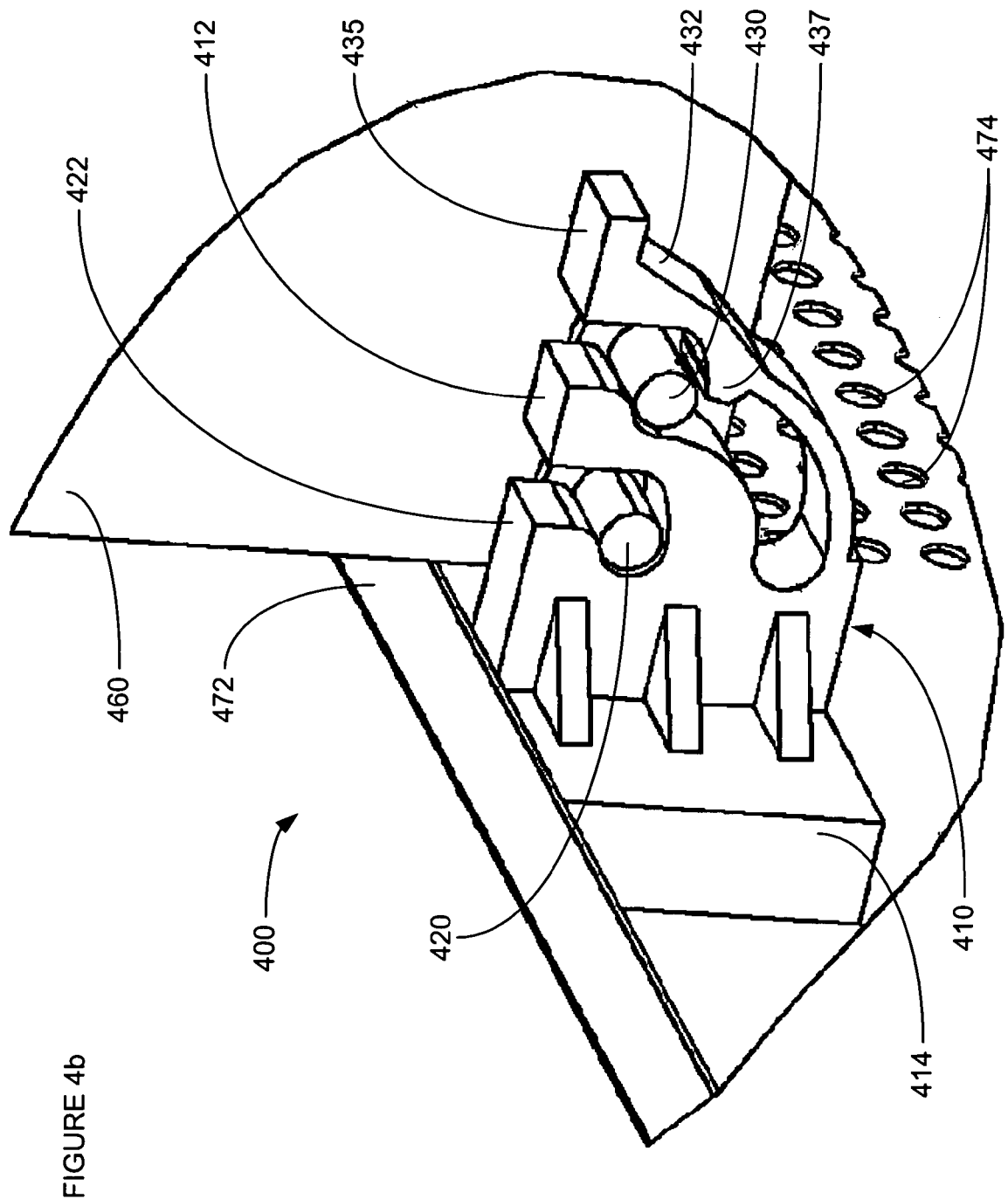
Figure 4C:
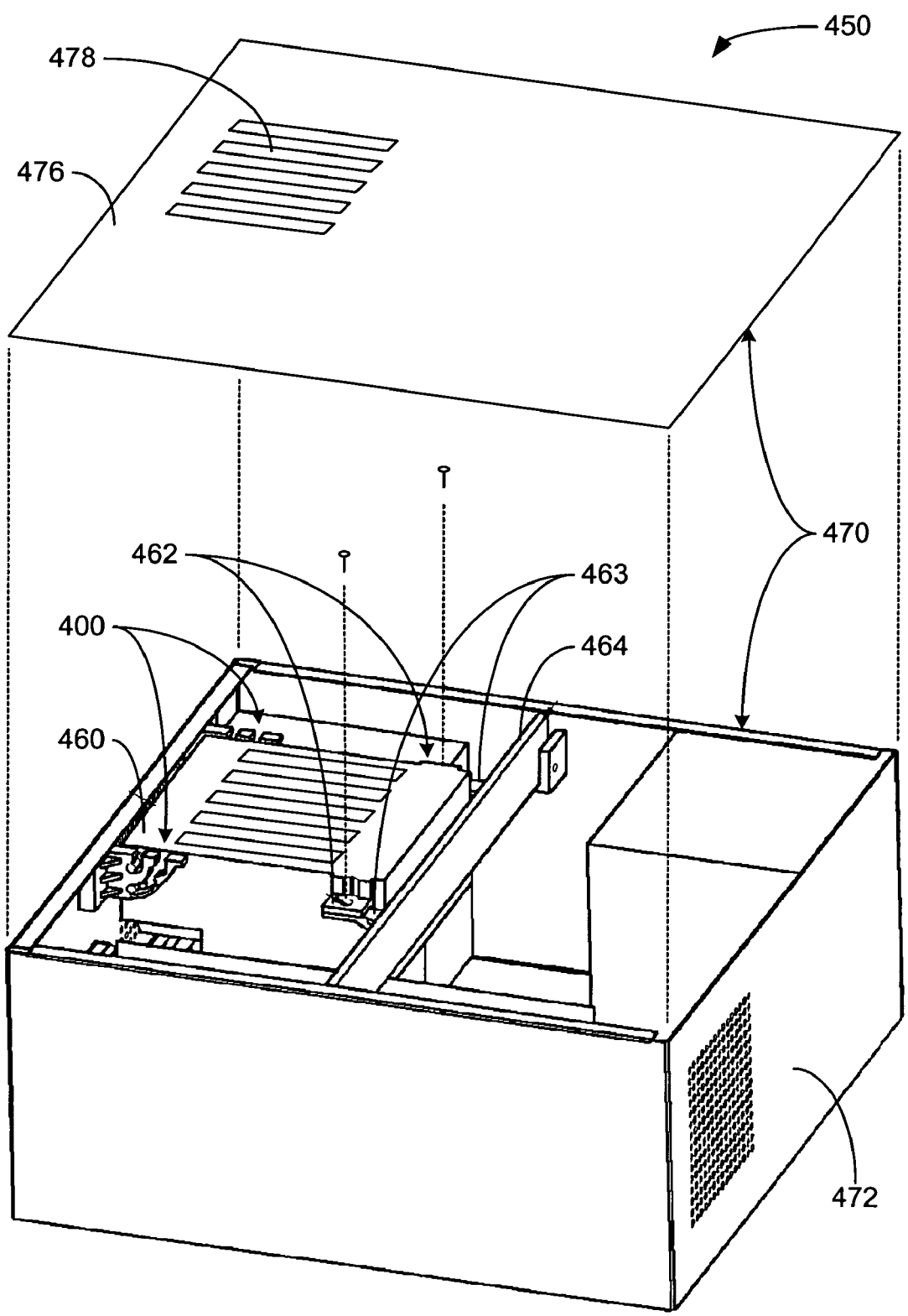

FIGS. 4a through 4c depict embodiments of one of a pair of cooling system hinges and an assembly employing a pair of cooling system hinges. Assembly 450 is made up principally of a pair of cooling system hinges 400, cooling system 460 and enclosure 470. Enclosure 470 is made up of chassis 472 and cover 476, and in various embodiments, at least part of both chassis 472 and cover 476 are made up of metal. Also, enclosure 470 is the enclosure of an electronic system having an IC within that relies on cooling system 460 to aid in removing and releasing heat generated by the IC during normal operation of the electronic system. In some embodiments, enclosure 470 is the enclosure of a computer system, and the IC relying on cooling system 460 is a processor (and in some variations, perhaps more than one processor). In some embodiments, cooling system 460 employs a liquid to conduct heat away from the IC with the liquid being circulating between a heat absorber directly attached to the IC and cooling system 460 via hoses. Cooling system 460 employs a fan, possibly within cooling system 460, itself, to force air through cooling system 460 as part of releasing heat conducted to cooling system 460 from the IC to the surrounding air. In some embodiments, air inlet 478 is formed through cover 476 at a location that is aligned with air inlet 468 of cooling system 460 through which cooling system 460 takes in air, and air outlet 474 is formed through chassis 472 at a location that is aligned with air outlet 464 (not visible) through which cooling system 460 outputs the air taken in through air inlet 468 after heat conducted to cooling system 460 from the IC has been released by transferring it to that air. In alternate embodiments, air inlet 468 is not aligned with an air inlet on any part of the exterior of enclosure 470, but is instead, positioned on a portion of the surface of cooling system 460 that allows cooling system 460 to draw in air from within the interior of enclosure 470 to cause air flow within enclosure 470 to cool components within enclosure 470.

Like cooling system hinges 100, 200 and 300, each one of cooling system hinges 400 is made up principally of hinge mount 410, hinge pin 420 and lock pin 430. A pair of hinge mounts 410 are attached to a portion of chassis 472, while a pair of both hinge pins 420 and lock pins 430 are attached to opposing sides of cooling system 460 so as to engage with corresponding ones of the pair of hinge mounts 410. In the case of each one of the pair of cooling system hinges 400, hinge mount 410, hinge pin 420 and lock pin 430 cooperate to aid in releasably retaining cooling system 460 in engagement with chassis 472 such that cooling system 460 may either be pivotably attached to chassis 472 or entirely detached from chassis 472, as depicted in FIG. 4a. Furthermore, when cooling system 460 is pivotably attached to chassis 472, the pivotable nature of this attachment allows cooling system 460 to be pivoted into and retained in at least either an "open" position relative to chassis 470, as depicted in FIGS. 4a–b, or a "closed" position relative to chassis 470 as depicted in FIG. 4c.

Somewhat like hinge mounts 110, 210 and 310, hinge mount 410 is made up principally of mounting base 414 with central beam 412, hinge pin holding beam 422 and lock pin holding beam 432 emanating from mounting base 414, but without an equivalent to lock pin indicator beam 139, 239 or 339. In some embodiments, each one of hinge mount 410 is made from injection-molded plastic or similar material, thereby electrically isolating cooling system 460 from chassis 472 such that electric currents that might be conducted through cooling liquid between a heat absorber attached to the IC and cooling system 460 are not allowed to be further conducted between cooling system 460 and chassis 472, thereby aiding in the prevention of galvanic corrosion and/or the creation of ground loops.

Pairs of both hinge pin 420 and lock pin 430 are attached to and protrude from opposing sides of cooling system 460 to engage corresponding ones of pairs of hinge mounts 410 attached to chassis 472. In the case of each single cooling system hinge 400, hinge pin 420 is positioned to protrude into the groove defined between central beam 412 and hinge pin holding beam 422, and lock pin 430 is positioned to protrude into a groove defined between central beam 412 and lock pin holding beam 432. Both of these grooves in each one of the pair of cooling system hinges 400 are open on one end to allow cooling system 460 to be pivotably attached to chassis 472 by inserting corresponding ones of hinge pins 420 and lock pins 430 into these grooves. However, unlike hinge mounts 110, 210 and 310, neither hinge pin holding beam 422 nor lock pin holding beam 432 feature any bumps to completely restrain the movement of either hinge pin 420 or lock pin 430 within either groove—only partial restraint occurs in some directions of movement.

Much like bump 137 of hinge mount 110, bump 437 is positioned towards the end of the groove defined between lock pin holding beam 432 and central beam 412 that is nearest the opening by which lock pin 430 may be moved into or out of the groove. Although bump 437 is positioned close to this opening, a portion of the channel continues onward between bump 437 and the opening to the channel to permit to be at least partially inserted into the channel, and perhaps rest within the channel, at a position before encountering and interacting. In some embodiments, thumb tab 435 is operated to move lock pin holding beam 432 away from central beam 412 so as to move bump 437 out of the path of lock pin 430 to allow lock pin 430 to either proceed beyond bump 437 and further into the channel, or to allow lock pin 430 to be released from being further within the channel.

In some embodiments, chassis 472 may provide crossbeam 464 with crossbeam tabs 463 to engage screws (or other fasteners) used with cooling system tabs 462 to aid in retaining cooling system 460 in a closed position. In such an embodiment, cooling system 460 may be pivoted on the pair of cooling system hinges 400 into closed position relative to chassis 472, and then screws (or other fasteners) installed to attach cooling system tabs 462 to crossbeam tabs 463, and then cover 476 may be installed with the screws carrying out this attachment not protruding through cover 476.

What is claimed is:

1. An apparatus comprising:
    a first hinge pin protruding from a first side of a cooling device;
    a first lock pin protruding from the first side of the cooling device in a direction that is substantially parallel to the first hinge pin;

a first mounting base;

a first central beam of elongate and curving shape, and protruding from the first mounting base;

a first hinge pin holding beam of elongate and curving shape, protruding from the first mounting base along the inner side of the curve of the first central beam, and defining a first channel between the first hinge pin holding beam and the first central beam having an open end to receive the first hinge pin; and a first lock pin holding beam of elongate and curving shape, protruding from the first mounting base along the outer side of the curve of the first central beam, and defining a curved second channel between the first lock pin holding beam and the first central beam having an open end to receive the first lock pin.

2. The apparatus of claim 1, further comprising:

a first bump formed on the first hinge pin holding beam and protruding into the first channel in the vicinity of the open end of the first channel so as to constrict the width of the open end of the first channel to releasably retain the first hinge pin; and a second bump formed on the first lock pin holding beam and protruding into the second channel in the vicinity of the open end of the second channel so as to constrict the width of the open end of the second channel to releasably retain the first lock pin.

3. The apparatus of claim 2, further comprising a first thumb tab formed at the end of the first hinge pin holding beam furthest from the first mounting base, wherein the first hinge pin holding beam is flexible so as to enable the first thumb tab to be operated to bend the first hinge pin holding beam so as to move the first bump to widen the open end of the first channel to allow the first hinge pin to be released from within the first channel.

4. The apparatus of claim 2, further comprising a third bump formed on the first lock pin holding beam, protruding into the second channel, and positioned adjacent to the second bump to cooperate with the second bump to releasably retain the first lock pin substantially motionless within the second channel in the vicinity of the open end of the second channel.

5. The apparatus of claim 2, further comprising a second thumb tab formed at the end of the first lock pin holding beam furthest from the first mounting base, wherein the first lock pin holding beam is flexible so as to enable the second thumb tab to be operated to bend the first lock pin holding beam so as to move the second bump and to widen the open end of the second channel to allow the first lock pin to be released from within the second channel.

6. The apparatus of claim 2, further comprising a flexible and curving first lock pin indicator beam protruding from the first mounting base and into the second channel to cooperate with the first lock pin holding beam to form a pocket to receive and releasably retain the first lock pin substantially motionless at the end of the second channel opposite to the open end of the second channel at which the second bump is positioned.

7. The apparatus of claim 1, further comprising:

a second hinge pin protruding from a second side of the cooling device that is opposite the first side;

a second lock pin protruding from the second side of the cooling device in a direction that is substantially parallel to the second hinge pin;

a second mounting base;

a second central beam of elongate and curving shape, and protruding from the second mounting base;

a second hinge pin holding beam of elongate and curving shape, protruding from the second mounting base along the inner side of the curve of the second central beam, and defining a third channel between the second hinge pin holding beam and the second central beam having an open end to receive the second hinge pin; and a second lock pin holding beam of elongate and curving shape, protruding from the second mounting base along the outer side of the curve of the second central beam, and defining a curved fourth channel between the second lock pin holding beam and the second central beam having an open end to receive the second lock pin.

8. The apparatus of claim 7, further comprising:

a fourth bump formed on the second hinge pin holding beam and protruding into the third channel in the vicinity of the open end of the third channel so as to constrict the width of the open end of the third channel to releasably retain the second hinge pin; and a five bump formed on the second lock pin holding beam and protruding into the fourth channel in the vicinity of the open end of the fourth channel so as to constrict the width of the open end of the fourth channel to releasably retain the second lock pin.

9. An apparatus comprising:

a chassis of an electronic device having an integrated circuit to be cooled;

a first mounting base attached to an interior surface of the chassis;

a first central beam of elongate and curving shape, and protruding from the first mounting base;

a first hinge pin holding beam of elongate and curving shape, protruding from the first mounting base along the inner side of the curve of the first central beam, and defining a first channel between the first hinge pin holding beam and the first central beam having an open end to receive a first hinge pin protruding from a first side of a cooling device; and a first lock pin holding beam of elongate and curving shape, protruding from the first mounting base along the outer side of the curve of the first central beam, and defining a curved second channel between the first lock pin holding beam and the first central beam having an open end to receive a first lock pin also protruding from the first side of the cooling device.

10. The apparatus of claim 9, further comprising:

a first bump formed on the first hinge pin holding beam and protruding into the first channel in the vicinity of the open end of the first channel so as to constrict the width of the open end of the first channel to releasably retain the first hinge pin; and a second bump formed on the first lock pin holding beam and protruding into the second channel in the vicinity of the open end of the second channel so as to constrict the width of the open end of the second channel to releasably retain the first lock pin.

11. The apparatus of claim 10, further comprising a first thumb tab formed at the end of the first hinge pin holding beam furthest from the first mounting base, wherein the first hinge pin holding beam is flexible so as to enable the first thumb tab to be operated to bend the first hinge pin holding beam so as to move the first bump to widen the open end of the first channel to allow the first hinge pin to be released from within the first channel.

12. The apparatus of claim 10, further comprising a third bump formed on the first lock pin holding beam, protruding into the second channel, and positioned adjacent to the second bump to cooperate with the second bump to releasably retain the first lock pin substantially motionless within the second channel in the vicinity of the open end of the second channel.

13. The apparatus of claim 10, further comprising a second thumb tab formed at the end of the first lock pin holding beam furthest from the first mounting base, wherein the first lock pin holding beam is flexible so as to enable the second thumb tab to be operated to bend the first lock pin holding beam so as to move the second bump and to widen the open end of the second channel to allow the first lock pin to be released from within the second channel.

14. The apparatus of claim 10, further comprising a flexible and curving first lock pin indicator beam protruding from the first mounting base and into the second channel to cooperate with the first lock pin holding beam to form a pocket to receive and releasably retain the first lock pin substantially motionless at the end of the second channel opposite to the open end of the second channel at which the second bump is positioned.

15. The apparatus of claim 9, further comprising:
a second mounting base attached to an interior surface of the chassis;
a second central beam of elongate and curving shape, and protruding from the second mounting base;
a second hinge pin holding beam of elongate and curving shape, protruding from the second mounting base along the inner side of the curve of the second central beam, and defining a third channel between the second hinge pin holding beam and the second central beam having an open end to receive a second hinge pin protruding from a second side of the cooling device that is opposite the first side of the cooling device; and
a second lock pin holding beam of elongate and curving shape, protruding from the second mounting base along the outer side of the curve of the second central beam, and defining a curved fourth channel between the second lock pin holding beam and the second central beam having an open end to receive a second lock pin also protruding from the second side of the cooling device.

16. The apparatus of claim 15, further comprising:
a fourth bump formed on the second hinge pin holding beam and protruding into the third channel in the vicinity of the open end of the third channel so as to constrict the width of the open end of the third channel to releasably retain the second hinge pin; and
a five bump formed on the second lock pin holding beam and protruding into the fourth channel in the vicinity of the open end of the fourth channel so as to constrict the width of the open end of the fourth channel to releasably retain the second lock pin.

17. The apparatus of claim 9, further comprising a crossbeam attached to at least one interior surface of the chassis having a tab to engage a screw protruding through a corresponding tab extending from the cooling device.

18. The apparatus of claim 9, further comprising an air inlet formed through a portion of the chassis to align with a corresponding air inlet formed through a third side of the cooling device when the cooling device is installed within the chassis such that the first hinge pin is inserted into the first channel, the first lock pin is inserted into the second channel, and the cooling device is pivoted along the axis of the first hinge pin to a position at which the cooling device is entirely within the chassis.

19. The apparatus of claim 9, wherein the cooling device cools the integrated circuit by transfer of heat away from the integrated circuit and to the cooling device through a liquid coolant.

20. A hinge mount comprising:
a first mounting base formed from an electrically insulating material;
a first central beam of elongate and curving shape, and protruding from the first mounting base;
a first hinge pin holding beam of elongate and curving shape, protruding from the first mounting base along the inner side of the curve of the first central beam, and defining a first channel between the first hinge pin holding beam and the first central beam having an open end to receive a first hinge pin protruding from a side of a cooling device; and
a first lock pin holding beam of elongate and curving shape, protruding from the first mounting base along the outer side of the curve of the first central beam, and defining a curved second channel between the first lock pin holding beam and the first central beam having an open end to receive a first lock pin protruding from a side of a cooling device.

21. The hinge mount of claim 20, further comprising:
a first bump formed on the first hinge pin holding beam and protruding into the first channel in the vicinity of the open end of the first channel so as to constrict the width of the open end of the first channel to releasably retain the first hinge pin; and
a second bump formed on the first lock pin holding beam and protruding into the second channel in the vicinity of the open end of the second channel so as to constrict the width of the open end of the second channel to releasably retain the first lock pin.

22. The hinge mount of claim 21, further comprising a first thumb tab formed at the end of the first hinge pin holding beam furthest from the first mounting base, wherein the first hinge pin holding beam is flexible so as to enable the first thumb tab to be operated to bend the first hinge pin holding beam so as to move the first bump to widen the open end of the first channel to allow the first hinge pin to be released from within the first channel.

23. The hinge mount of claim 21, further comprising a third bump formed on the first lock pin holding beam, protruding into the second channel, and positioned adjacent to the second bump to cooperate with the second bump to releasably retain the first lock pin substantially motionless within the second channel in the vicinity of the open end of the second channel.

24. The hinge mount of claim 21, further comprising a second thumb tab formed at the end of the first lock pin holding beam furthest from the first mounting base, wherein the first lock pin holding beam is flexible so as to enable the second thumb tab to be operated to bend the first lock pin holding beam so as to move the second bump and to widen the open end of the second channel to allow the first lock pin to be released from within the second channel.

25. The hinge mount of claim 21, further comprising a flexible and curving first lock pin indicator beam protruding from the first mounting base and into the second channel to cooperate with the first lock pin holding beam to form a pocket to receive and releasably retain the first lock pin substantially motionless at the end of the second channel opposite to the open end of the second channel at which the second bump is positioned.

26. The hinge mount of claim 20, wherein the hinge mounting base, the first central beam, the first hinge pin holding beam and the lock pin holding beam are fabricated from plastic.

* * * * *